(12) United States Patent
Horiuchi et al.

(10) Patent No.: US 8,207,924 B2
(45) Date of Patent: Jun. 26, 2012

(54) DISPLAY DEVICE

(75) Inventors: Satoshi Horiuchi, Taki-Gun (JP); Yuhko Hisada, Matsusaka (JP); Tomoo Furukawa, Matsusaka (JP); Ryohki Itoh, Taki-Gun (JP); Takahura Yamada, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 944 days.

(21) Appl. No.: 12/159,953

(22) PCT Filed: Oct. 11, 2006

(86) PCT No.: PCT/JP2006/320284
§ 371 (c)(1),
(2), (4) Date: Jul. 2, 2008

(87) PCT Pub. No.: WO2007/088656
PCT Pub. Date: Aug. 9, 2007

(65) Prior Publication Data
US 2009/0051638 A1    Feb. 26, 2009

(30) Foreign Application Priority Data
Feb. 2, 2006  (JP) ................................ 2006-025390

(51) Int. Cl.
*G09G 3/36* (2006.01)
(52) U.S. Cl. ............................................. 345/88; 345/6
(58) Field of Classification Search ........ 345/55, 345/88, 6, 690
See application file for complete search history.

(56) References Cited

U.S. PATENT DOCUMENTS

| 5,899,550 A * | 5/1999 | Masaki .................... 349/109 |
| 6,738,204 B1 * | 5/2004 | Chuang et al. ............. 359/891 |
| 6,950,156 B1 | 9/2005 | Yoshida |
| 7,365,722 B2 | 4/2008 | Lee |
| 7,388,630 B2 | 6/2008 | Shin et al. |
| 7,515,122 B2 * | 4/2009 | Miller et al. ................ 345/76 |
| 2004/0021677 A1 * | 2/2004 | Sasaki et al. ............... 345/694 |
| 2004/0150583 A1 * | 8/2004 | Fukushima et al. .......... 345/6 |
| 2004/0246274 A1 * | 12/2004 | Rykowski et al. .......... 345/690 |
| 2004/0252266 A1 * | 12/2004 | Shimizu et al. ............. 349/139 |
| 2007/0120876 A1 * | 5/2007 | Nishida et al. ............. 345/690 |

FOREIGN PATENT DOCUMENTS

| JP | 02-118521 A | 5/1990 |
| JP | 10-010998 A | 1/1998 |
| JP | 11-295717 A | 10/1999 |
| JP | 2000-098128 A | 4/2000 |
| JP | 2001-296523 A | 10/2001 |
| JP | 2004-177726 A | 6/2004 |

OTHER PUBLICATIONS

Official communication issued in the International Application No. PCT/JP2006/320284, mailed on Nov. 21, 2006.

* cited by examiner

*Primary Examiner* — Amare Mengistu
*Assistant Examiner* — Premal Patel
(74) *Attorney, Agent, or Firm* — Keating & Bennett, LLP

(57) ABSTRACT

A display device improves brightness while minimizing an increase in the number of source drivers. When a value obtained by dividing the length of a display screen in a row direction by the number of pixels in the row direction is a length corresponding to one pixel in the row direction, one period of color arrangement in the row direction is a length corresponding to two pixels. One such period of color arrangement includes two groups of subpixels that include first subpixels of the light's three primary colors of red (R), green (G) and blue (B), that are arranged in a row and that have the same subpixel configuration; and at least one additional subpixel. Scanning lines extending in the row direction and signal lines extending in the column direction are connected to the first subpixels and the at least one additional subpixel.

18 Claims, 20 Drawing Sheets

DISPLAY DEVICE

BACKGROUND OF THE INVENTION

1. Field of the Invention

The present invention relates to display devices provided with a display panel for color display such as a liquid crystal display or an organic electroluminescent (EL) display.

2. Description of the Related Art

Such display devices are generally provided with a display panel that produces color images with a large number of pixels arranged regularly. These display devices are widely used as display screens such as those for personal computers, mobile telephones, portable information devices and thin television sets. Here, in order to achieve color display, each pixel is generally composed of subpixels of light's three primary colors, namely, red (R), green (G) and blue (B). The term "subpixel" refers to a display unit that can be individually controlled to be driven.

Colors of subpixels contained in one pixel are not particularly limited to the light's three primary colors as long as color display is achieved. For example, the colors of subpixels may be three primary colors, namely, cyan (C), yellow (Y) and magenta (M), that serve as complementary colors for the light's three primary colors; the colors of subpixels may include the light's three primary colors and the complementary three primary colors.

Scanning lines (gate lines) extending in a row direction (in the horizontal direction of a display screen) and signal lines (source lines) extending in the column direction (in the vertical direction of the display screen) are connected to subpixels. Subpixels are driven by source and gate signals applied from a controller through the scanning lines and signal lines, and thus color display is achieved.

In order to produce high-definition, high-quality color images, a variety of configurations of subpixels are conventionally employed since color images are significantly affected such as by the configuration of subpixels of which pixels are composed. In general, the arrangements of three-color subpixels, when the light's three primary colors (R, G and B) are employed, include a stripe arrangement, a mosaic arrangement, a square arrangement and a delta arrangement.

In the stripe arrangement, as shown in FIG. 33, three subpixels (each having a different color) of one pixel are arranged in a row, and this is repeated in a row direction; such a row is repeatedly arranged in the column direction such that the subpixels of the same colors are arranged in the column direction. In the mosaic arrangement, as shown in FIG. 34, three subpixels (each having a different color) of one pixel are arranged in a row, and this is repeated in the row direction; each row is shifted by one subpixel relative to the next in the row direction such that subpixels are arranged one color after another in the column direction.

In the square arrangement, as shown in FIG. 35, four subpixels (with the three colors being used such that one red (R), one blue (B) and two green (G) subpixels are selected) of one pixel are arranged in two rows to form a square shape, and this is repeated in a row direction; two such rows are arranged in the column direction. In the delta arrangement, as shown in FIG. 36, three subpixels (each having a different color) of one pixel are arranged in two rows to form a delta shape, and this is repeated in a row direction while being inverted for each repetition; each row is shifted by one-half of the subpixel relative to the next in the row direction such that two such rows are repeatedly arranged in the column direction.

Theses color arrangements of subpixels are selectively used for different products; in particular, the stripe arrangement is often used in display devices for television sets and personal computers required to have high definition.

A source signal having a voltage whose positive/negative polarity is periodically inverted is applied to each signal line. In order to reduce the generation of display flickering called flicker, a polarity-inversion drive method is generally employed in which source signals having voltages whose polarities alternate or vary from one subpixel to the next along a row are applied. In order to reduce flicker occurring in the column direction, source signals having voltages whose polarities alternate from one subpixel to the next along a column are applied.

Display devices today are required to further improve brightness. One way to fulfill this requirement is to form one pixel from four-color subpixels composed of three subpixels of the light's three primary colors (R, G and B) and one additional high-brightness subpixel of white (W) or the like and to arrange such pixels (for example, see patent documents 1 to 5). In this way, the subpixel of the fourth color improves the brightness of the pixel, with the result that the basic performance of a display device is improved.

Patent document 1: JP-A-H02-118521
Patent document 2: JP-A-H11-295717
Patent document 3: JP-A-H10-010998
Patent document 4: JP-A-2004-102292
Patent document 5: JP-A-2005-062869

In a case where the subpixel of the fourth color is added to one pixel to improve brightness, however, the following problem occurs. The addition of the subpixel of the fourth color to each pixel increases the number of source drivers for each pixel by the subpixel added. The source driver mentioned herein refers to a device that outputs a drive signal to a signal line; one source driver is provided for each signal line.

SUMMARY OF THE INVENTION

In order to overcome the problems described above, preferred embodiments of the present invention provide a display device that improves brightness while minimizing an increase in the number of source drivers.

A display device according to a preferred embodiment of the present invention includes a display panel having subpixels arranged on a display screen, each subpixel connected to a scanning line extending in a row direction and a signal line extending in the column direction. This display device has the following features.

When a value obtained by dividing the length of the display screen in the row direction by the number of pixels in the row direction is a length corresponding to one pixel in the row direction, one period of color arrangement in the row direction is a length corresponding to m (two or more) pixels. One such period for color arrangement includes: m group of subpixels that include at least subpixels of the light's three primary colors or three primary colors serving as complementary colors for the light's three primary colors, that are arranged in one row and that have the same subpixel configuration; and one or more but less than m additional subpixels.

When a value obtained by dividing the length of the display screen in the row direction by the number of pixels in the row direction is a length corresponding to one pixel in the row direction, one period of color arrangement in the row direction is a length corresponding to m (two or more) pixels. One such period for color arrangement includes: m group of subpixels that include at least subpixels of the light's three primary colors or three primary colors serving as complementary colors for the light's three primary colors, that are arranged in two rows and two columns so as not to be disposed and that have the same subpixel configuration; and one or more but less than m lines of additional subpixels.

When a value obtained by dividing the length of the display screen in the row direction by the number of pixels in the row direction is a length corresponding to one pixel in the row direction, one period of color arrangement in the row direction is a length corresponding to m (two or more) pixels. One such period for color arrangement includes: m group of subpixels that include at least subpixels of the light's three primary colors or three primary colors serving as complementary colors for the light's three primary colors, that are arranged in two rows such that one row is shifted by one-half of the subpixel relative to the next and that have the same subpixel configuration; and one or more but less than m additional subpixels.

In such a display device, within the length of one period of color arrangement in the row direction, that is, a length corresponding to m pixels, subpixels contained in m groups of subpixels, the number of groups of subpixels being the same as that of pixels are included, and one or more but less than m additional subpixels, the number of which is less than that of pixels are also included. Then, source drivers corresponding to these subpixels are included. Thus, it is possible to prevent an increase in the number of source drivers as compared with a conventional display device in which an additional subpixel is provided for each pixel so as to improve brightness.

With the display device according to various preferred embodiments of the present invention, it is possible to improve brightness while minimizing an increase in the number of source drivers.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
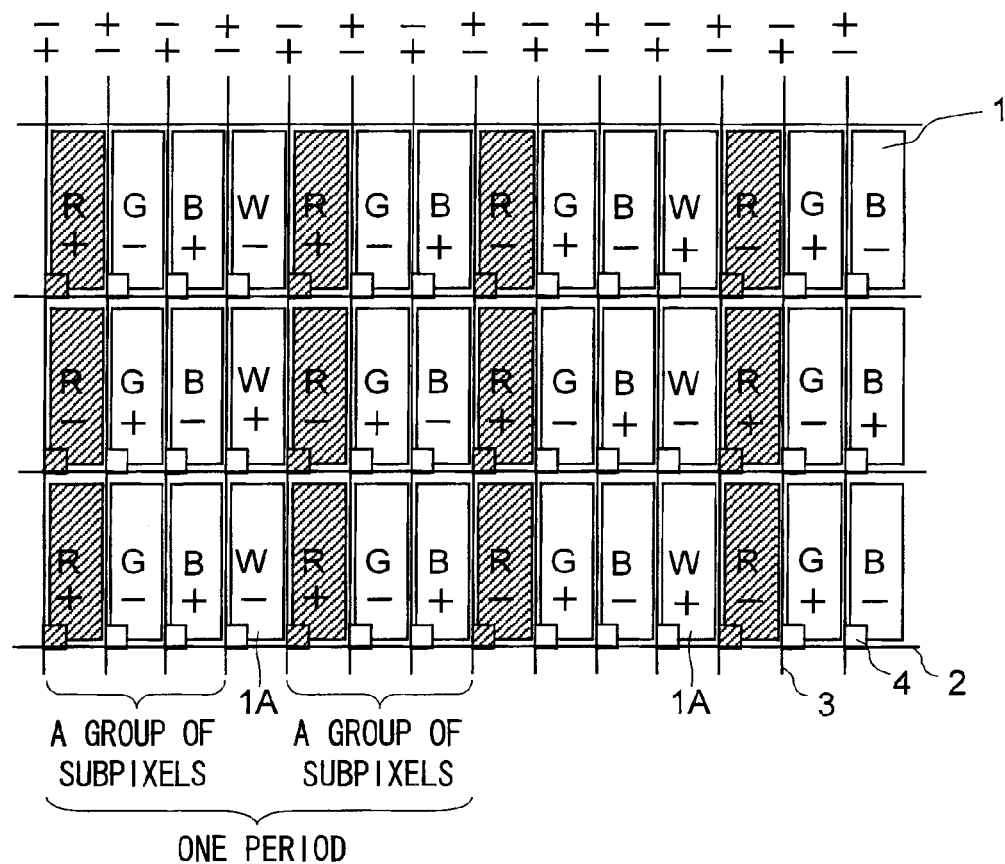
FIG. 1 is a plan view showing the configuration of a display panel in a display device according to a first preferred embodiment of the present invention.
Figure 2:
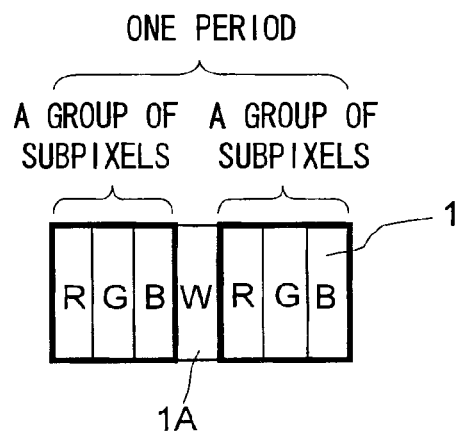
FIG. 2 is an enlarged schematic view showing a subpixel color arrangement in the display panel of the first preferred embodiment of the present invention.
Figure 3:
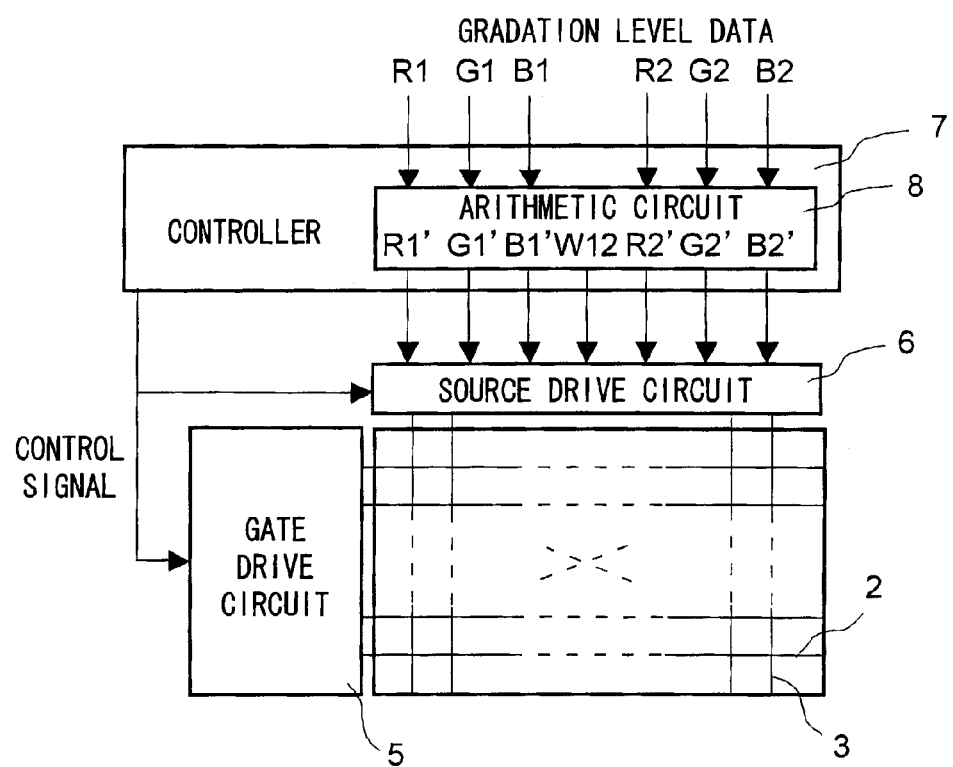
FIG. 3 is a block diagram showing the overall configuration of the display panel.

Hereinafter, preferred embodiments of the present invention will be described with reference to the accompanying drawings. A description will first be given of a display device according to a first preferred embodiment of the invention. FIG. 1 is a plan view showing the configuration of a display panel in the display device of the first preferred embodiment. FIG. 2 is an enlarged schematic view showing a subpixel color arrangement in the display panel. FIG. 3 is a block diagram showing the overall configuration of the display panel.

Now, a value obtained by dividing the length of a display screen in a row direction by the number of pixels in the row direction is defined to be a length corresponding to one pixel in the row direction; a value obtained by dividing the length of the display screen in the column direction by the number of pixels in the column direction is defined to be a length corresponding to one pixel in the column direction. In the display panel of this preferred embodiment, the stripe arrangement is preferably used for the color arrangement of subpixels 1, a length corresponding to two pixels in the row direction is assumed to be one period of color arrangement and this is repeatedly arranged in the row direction.

Specifically, in one such period, seven subpixels 1 of red (R), green (G), blue (B), white (W), red (R), green (G) and blue (B) are preferably arranged along each row. The subpixels 1 of red (R), green (G) and blue (B) located in the left half of one such period constitute a group of subpixels for one pixel; the subpixels 1 of red (R), green (G) and blue (B) located in the right half constitute a group of subpixels for the other pixel; and an additional subpixel 1A is provided therebetween to improve brightness. That is, in one such period, two groups of subpixels are included, each group including the subpixels of the light's three primary colors of red (R), green (G) and blue (B) and one additional subpixel 1A of white (W) or the fourth color is also included. Such a row is repeatedly arranged in the column direction such that the subpixels 1 and the additional subpixels 1A of the same colors are arranged in the column direction. The location of the additional white (W) subpixel is not particularly limited. Preferably, however, the additional white (W) subpixel is located in the middle of the seven subpixels 1.

In this preferred embodiment, the subpixels 1 including the additional subpixel 1A each have the same area although the colors thereof are different from each other. The subpixels 1 each have the same gate-to-drain capacitance and the auxiliary capacitance.

The subpixels 1 including the additional subpixel 1A are each provided with a thin film transistor (TFT) 4 serving as a switching element. Scanning lines 2 extending in a row direction and signal lines 3 extending in the column direction are connected to the TFTs 4. The scanning lines 2 are all connected to a gate drive circuit 5; the signal lines 3 are all connected to a source drive circuit 6. The gate drive circuit 5 and the source drive circuit 6 are connected to a controller 7; they are controlled by control signals outputted from the controller 7; and they output gate signals and source signals for driving subpixels 1 to the scanning lines 2 and signal lines 3.

In particular, an arithmetic circuit 8 is included in the controller 7. For each of two groups of subpixels contained in one period as described previously, this arithmetic circuit 8 receives six pieces of gradation level data (R1, G1, B1, R2, G2 and B2) inputted from the outside and corresponding respectively to two-pixel-worth of three-primary-color subpixels 1. The arithmetic circuit 8 calculates the gradation level of the additional white (W) subpixel 1A and modifies the gradation levels of the three-primary-color subpixels 1 according to the gradation level of the additional white (W) subpixel 1A. In this way, the arithmetic circuit 8 sets a total of seven pieces of gradation level data (R1', G1', B1', W12, R2', G2' and B2') for two pixels and outputs this data to the source drive circuit 6.

A description will now be given of how this display panel is fabricated. Hereinafter, a liquid crystal panel will be described as an example of the display panel.

A description will first be given of how a TFT array substrate is fabricated. Gate electrodes and gate conductors of aluminum or other material are formed on a glass substrate. Next, a gate insulating film of $SiO_2$ or other material is formed thereon by CVD or other techniques. Then, on top of the gate insulating film, amorphous silicon is first deposited in a layer and subsequently SiNx is deposited in a layer as an anti-etching protective film by CVD or other techniques to form a pattern of the anti-etching protective film. Thereafter, islands of $N^+$ amorphous silicon are formed. Then, display electrodes (subpixel electrodes), which are made of ITO (indium tin oxide), drain electrodes, source electrodes and the scanning lines 2 and signal lines 3 for driving the subpixels are deposited in films.

Here, the signal lines 3 for driving the subpixels, when attached to a color filter substrate, which will be described in detail later, are formed to be disposed on the left edges of the subpixels 1 including the additional subpixels 1A (see FIG. 1). However, the positions where the signal lines 3 are formed are not particularly limited; the signal lines 3 may be formed to be disposed on the right edges of the subpixels 1. The shape of the signal line 3 is not particularly limited; the signal lines 3 may be formed linearly or in such a zigzag shape that portions thereof enter the adjacent subpixels 1. Although in FIG. 1, the TFTs 4 are disposed at the lower left corners of the subpixels 1, the positions where the TFTs 4 are formed are not limited to this arrangement. For example, the signal lines 3 may be disposed on the right edges of the subpixels 4; the TFTs 4 may be disposed at the lower right corners of the subpixels 1. Finally, the fabrication of the TFT array substrate is completed by the formation of an oriented film through spin coating or other methods.

Figure 4A:
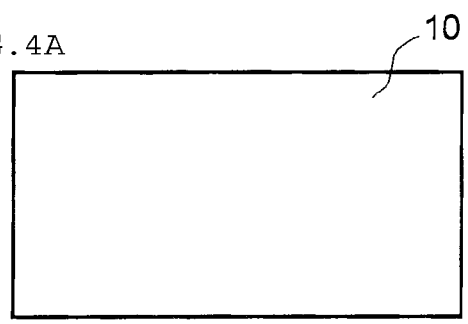
FIGS. 4A to 4F are diagrams showing the process of forming a color filter substrate.
Figure 4B:
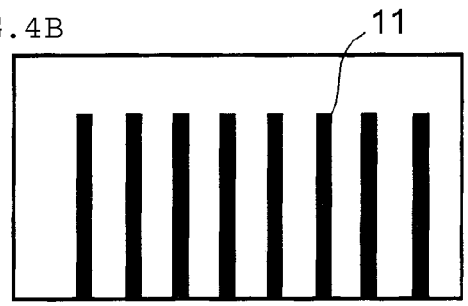
Figure 4C:
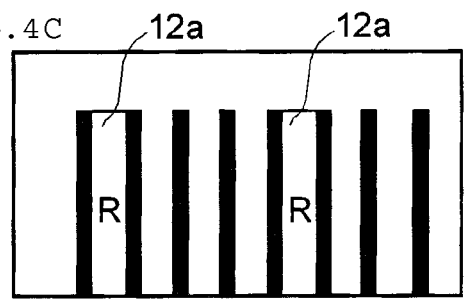
Figure 4D:
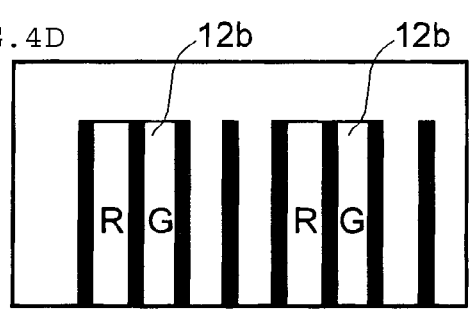
Figure 4E:
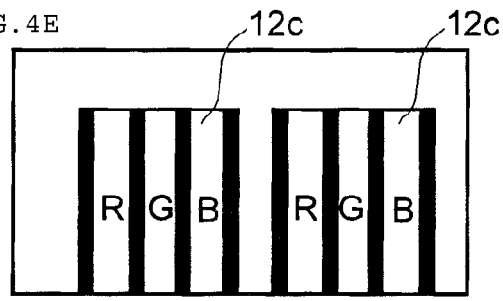
Figure 4F:
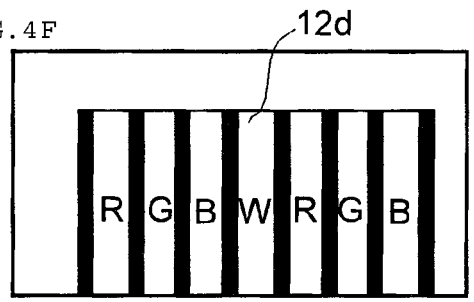

With reference to FIGS. 4A to 4F, a description will now be given of how the color filter substrate is fabricated. On the glass substrate 10 shown in FIG. 4A, as shown in FIG. 4B, a pattern of a black matrix 11 surrounding the subpixels including the additional subpixels 1A is formed with light-blocking material. As a result, the areas where the black matrix is not formed are produced that correspond respectively to the areas for the subpixels of red (R), green (G), blue (B) and white (W). Then, in the areas where the black matrix is not formed, as shown in FIGS. 4C to 4F, red (R) colored layers 12a, green (G) colored layers 12b, blue (B) colored layers 12c and white (W) colored layers 12d are formed one after another by dry film method. In this way, the color filter is obtained.

The method in which the colored layers 12a to 12d are formed is not particularly limited. Suitable methods, for example, include an ink jet method and a method in which the colored layers 12a to 12d are formed by applying on the substrate liquid material where pigments or the like are scattered. As long as the colored layers 12a to 12d are formed of pigments, compositions of the pigments and ratios of components of the pigments are not particularly limited, and may be flexibly determined to suit particular purposes.

Although the thicknesses of the colored portions of the colored layers 12a to 12d are not particularly limited, they are preferably constant. The reason for this will be described below. When the thicknesses of the colored portions of the color filters vary significantly, it is difficult to make uniform the thickness of the layer of the liquid crystal. In this case, the following problems may occur. First, response speed varies from one color filter to another. Second, an oblique view angle varies from one subpixel to another. Third, the capacitance of the liquid crystal varies from one color filter to another, and this causes flicker and burn-in. Thus, it is possible to solve these problems by making constant the thicknesses of the colored portions.

In a case, for example, where a color filter substrate is formed with priority given to high transmittance, the thicknesses of the colored portions of the colored layers 12a to 12d are preferably decreased. In a case, for example, where a color filter substrate is formed with priority given to high color purity, the thicknesses are preferably increased. Either a transparent colored layer or no colored layer may be formed as the colored layer 12d for the additional white (W) subpixel 1A. The black matrix 11 may be formed after the formation of the colored layers 12a to 12d.

Then, on top of the colored layers 12a to 12d, common electrodes of ITO are formed by sputtering, and an oriented film is further formed thereon. In this way, the fabrication of the color filter substrate is completed.

With respect to the TFT array substrate and the color filter substrate thus fabricated, plastic beads are scattered as spacers over the oriented film of the TFT array substrate. The type of spacer is not particularly limited. When columnar spacers are used, they are directly provided on the substrate. Finally, the color filter substrate and the TFT array substrate are attached to each other, liquid crystal material including liquid crystal molecules is injected therebetween and the color filter substrate and the TFT array substrate are then sealed together. In this way, the liquid crystal panel serving as a display panel is obtained.

Figure 5:
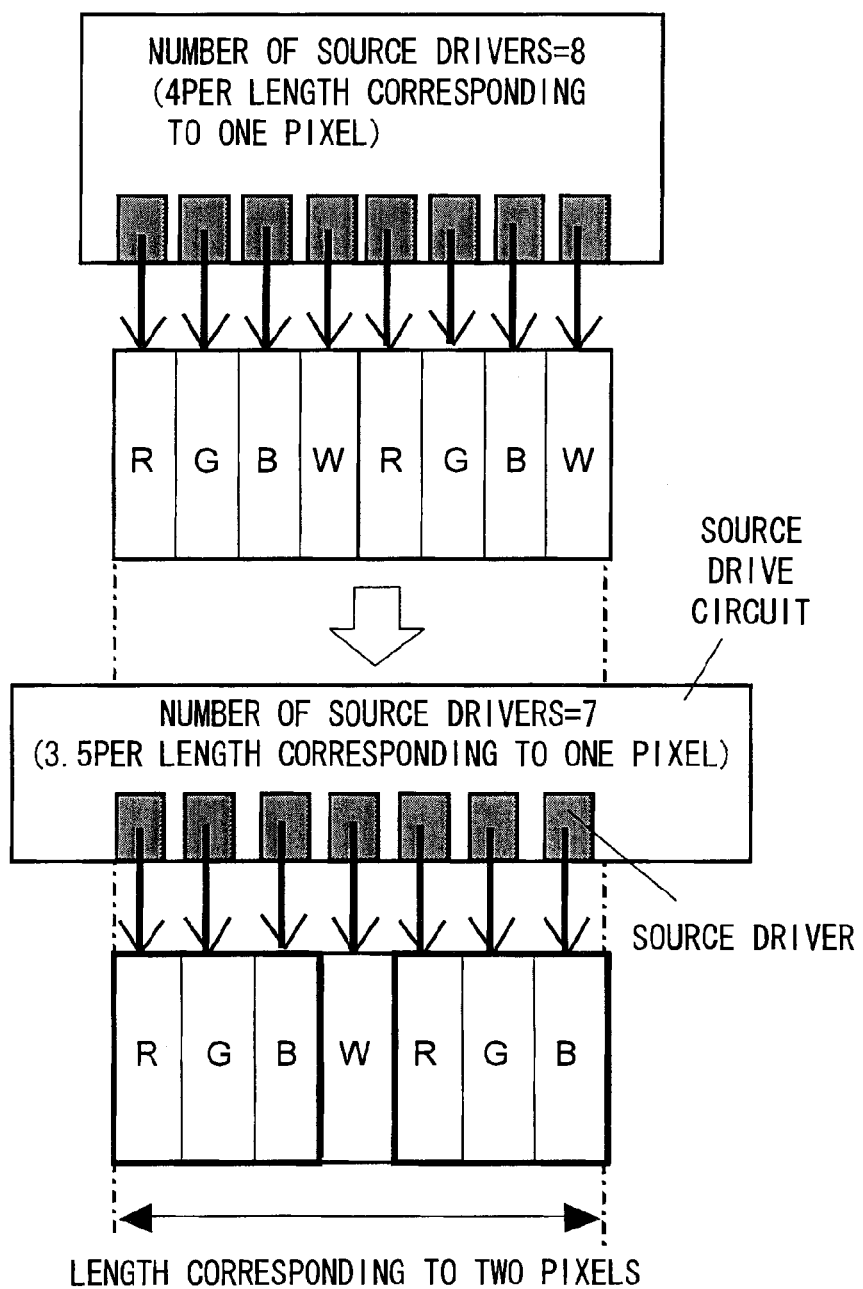
FIG. 5 is a diagram illustrating how the use of the color arrangement shown in FIG. 2 reduces the number of source drivers.

In the display device of this preferred embodiment provided with the display panel configured as described above, as shown in the bottom portion of FIG. 5, within the length of one period of color arrangement in the row direction, that is, within the length corresponding to two pixels, a total of six subpixels 1, that is, two groups of three subpixels 1, the number of groups being the same as that of pixels, are included and one additional white (W) subpixel, the number of which is less than that of pixels, is also included; thus, a total of seven source drivers are included that correspond to these individual subpixels. In contrast, in a conventional display device in which a subpixel is additionally provided for each pixel so as to improve brightness, as shown in the top portion of FIG. 5, within the length corresponding to two pixels, a total of six subpixels 1, that is, two groups of three subpixels 1, the number of groups being the same as that of pixels, are included and two additional white (W) subpixels, the number of which is the same as that of pixels, are also included; thus, a total of eight source drivers are included that correspond to these individual subpixels. Hence, with the display device according to a preferred embodiment of the present invention, it is possible to improve brightness while preventing an increase in the number of source drivers as compared with the conventional display device.

In this display device, according to an instruction from the controller 7, source signals are fed to the signal lines 3 by the polarity-inversion drive method, that is, source signals having voltages whose polarities alternate from one to the next of the subpixels 1 including the additional subpixels 1A along each row are applied to the signal lines 3. Thus, since the additional subpixels 1A and the subpixels 1 are repeatedly arranged along each row such that a total of seven subpixels (odd number) are included in one period, the polarities of voltages applied to the subpixels 1 of the same colors in each row alternate in each period. Hence, even when a single color is displayed, the subpixels 1 of the same colors in each row are lit such that their polarities alternate in each period, with the result that uneven display in the row direction due to crosstalk is reduced. Thus, it is possible to obtain good-quality color images. Since each group of subpixels contains subpixels 1 of the light's three primary colors of red (R), green (G) and blue (B), display of color images can be fully achieved, and high-brightness display images can be obtained with the additional white (W) subpixel 1A.

A specific example will be given below. As shown in FIG. 1, when source signals are fed to the signal lines 3 by the polarity-inversion drive method so as to light only red (R) subpixels, for example, the polarities of voltages applied to the red (R) subpixels in each row alternate in each period. In this way, uneven display is reduced. Moreover, in FIG. 1, in order for flicker to be reduced in the column direction, source signals having voltages whose polarities alternate from one subpixel 1 to the next along each column are fed.

Here, the signals having voltages whose polarities alternate from one subpixel 1 to the next along each row are used as source signals fed to the signal lines 3. However, signals having voltages whose polarities alternate on a two-subpixels-by-two-subpixels basis (for each of two adjacent subpixels 1) along each row may be used. Even with such a method, the polarities of voltages applied to the subpixels of the same colors in each row can likewise alternate in each period.

In a case where the polarity-inversion drive method is employed for a conventional display device in which a white (W) subpixel or the like is additionally provided for each pixel having three-color subpixels, since an even number of subpixels are repeatedly arranged along each row, the voltages applied to the subpixels of the same colors have the same polarity. Thus, when a single-color is displayed, the subpixels of the same colors in each row are lit when they have the same polarity. This causes, for example, an increase in the potential change of opposite electrodes and an increase in the load on the scanning lines, with the result that uneven display in the row direction due to cross talk is produced. That is, the display quality of color images is practically reduced.

Figure 37:
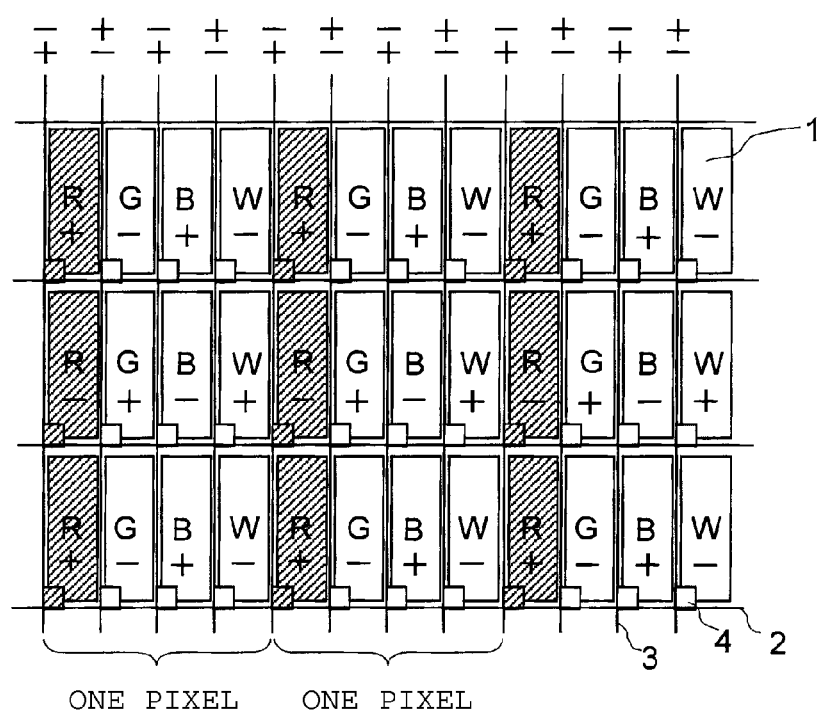
FIG. 37 is a plan view showing the configuration of a display panel in a conventional display device.

A specific example of this case will be shown in FIG. 37. FIG. 37 is a plan view showing the configuration of a display panel in a conventional display device. Here, one pixel includes four-color subpixels 1 of red (R), green (G), blue (B) and white (W), and the stripe arrangement is preferably used for the color arrangement of the subpixels 1. In each row, four subpixels (even number) constituting one pixel are repeatedly arranged in order of red (R), green (G), blue (B) and white (W); in the column direction, the subpixels 1 of the same colors are arranged. The subpixels 1 are each provided with a TFT 4; the scanning lines 2 extending in the row direction and the signal lines 3 extending in the column direction are connected to TFTs 4.

In the display panel configured as described above, when source signals are fed to the signal lines 3 by the polarity-inversion drive method so as to light only the red (R) subpixels, for example, the voltages applied to the red (R) subpixels 1 in each row have the same polarity. This causes uneven display. In FIG. 37, in order for flicker to be reduced in the column direction, the source signals having voltages whose polarities alternate from one subpixel 1 to the next along each column are fed.

When subpixels are additionally provided in order to improve brightness, the area occupied by the subpixels of the light's three primary colors of red (R), green (G) and blue (B) is inevitably reduced. In this preferred embodiment, however, since all the subpixels in one period each have the same area, each subpixel has a larger area than that of a conventional display device where a subpixel is additionally provided for each pixel, provided that the size of the display panel and the resolution (the number of pixels) are the same. Hence, advantageously, sufficient transmittance of the subpixels including those of the light's three primary colors of red (R), green (G) and blue (B) can be obtained, and a decrease in the brightness of each color subpixel can be prevented.

Figure 6A:
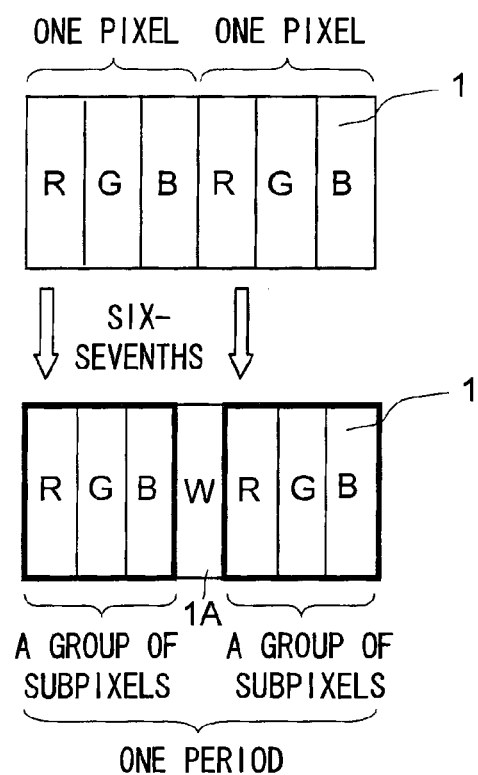
FIGS. 6A and 6B are diagrams illustrating how a reduction in brightness is prevented in the first preferred embodiment of the present invention.
Figure 6B:
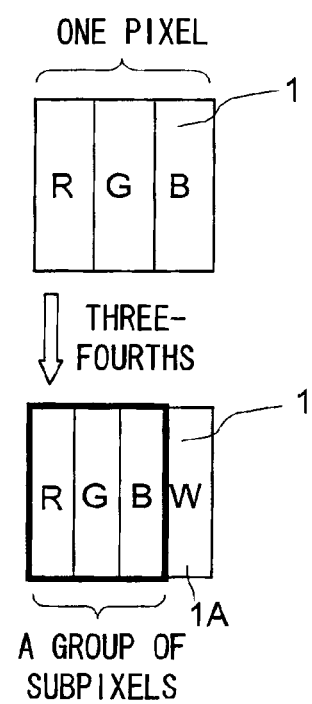

Specifically, as shown in the upper portion of FIG. 6A, in an original display device where no subpixel of the fourth color is additionally provided, six subpixels 1 are contained in two pixels; as shown in the lower portion of FIG. 6A, in the display device of this preferred embodiment, seven subpixels 1 (including the additional subpixel 1A) are preferably included in one period of color arrangement corresponding to two pixels. Thus, in this preferred embodiment, the area of each subpixel is only reduced to six-sevenths. In contrast, as shown in the upper portion of FIG. 6B, in the original display device, three subpixels are contained in one pixel; as shown in the lower portion of FIG. 6B, in a conventional display device where a subpixel is additionally provided for each pixel, four subpixels are contained in one pixel. Thus, in the conventional display device, the area of each subpixel is reduced to three-fourths (=six-eighths). Hence, with the display device of this preferred embodiment, it is possible to obtain a larger area for each subpixel than the conventional display device where a subpixel is additionally provided for each pixel.

With reference to FIGS. 3 and 7 to 11, a description will now be given of a preferred method by which a gradation level of the additional white (W) subpixel 1A is set.

The first method is to employ three-primary-color subpixels 1 contained in one of two groups of subpixels 1 located on the left and right sides of the additional white (W) subpixel 1A and to set a gradation level of the additional white (W) subpixel 1A based on the gradation levels of the subpixels 1 employed. In this case, the gradation levels of the subpixels of the three primary colors of red (R), green (G) and blue (B) contained in the other group of subpixels are not involved.

Figure 7:
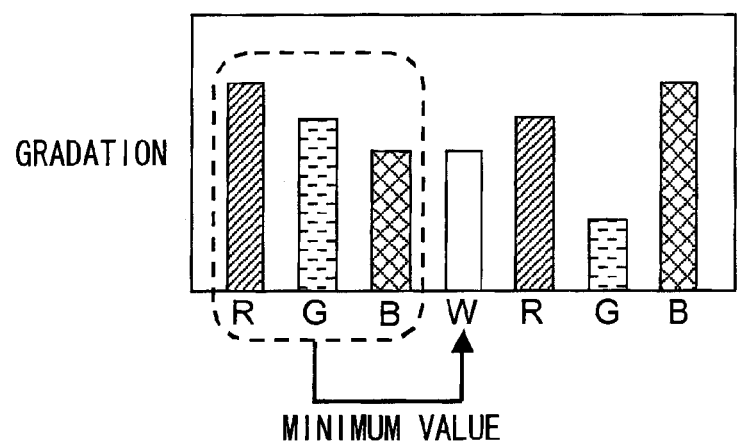
FIG. 7 is a diagram illustrating one method of setting a gradation level of a subpixel.

For example, as shown in FIG. 7, in two groups of subpixels included in one period, a subpixel having the lowest gradation level is selected from the subpixels 1 of the three primary colors of red (R), green (G) and blue (B) contained in the group of subpixels located on the left side of the additional white (W) subpixel 1A. The gradation level of the additional white (W) subpixel 1A is set at the gradation level of the selected subpixel; in this case, it is set at the gradation level of the subpixel 1 represented by B.

Figure 8:
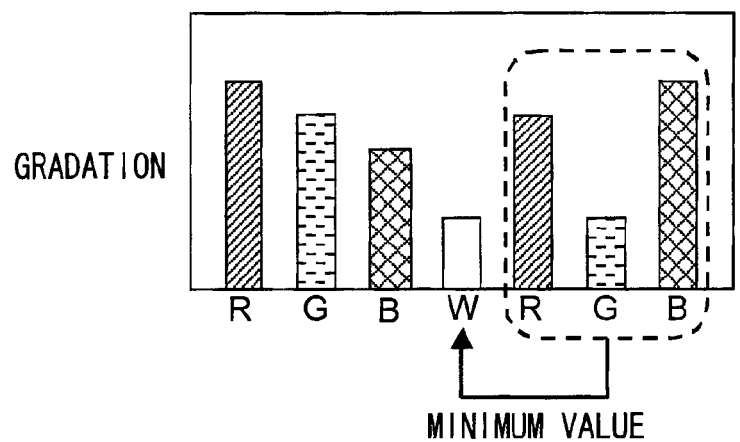
FIG. 8 is a diagram illustrating one method of setting a gradation level of subpixel.

In contrast, as shown in FIG. 8, in two groups of subpixels included in one period, a subpixel having the lowest gradation level is selected from the subpixels 1 of the three primary colors of red (R), green (G) and blue (B) contained in the group of subpixels located on the right side of the additional white (W) subpixel 1A. The gradation level of the additional white (W) subpixel 1A may be set at the gradation level of the selected subpixel; in this case, it is set at the gradation level of the subpixel 1 represented by G.

The second method is to employ three-primary-color subpixels 1 contained in both groups of subpixels 1 located on the left and right sides of the additional white (W) subpixel 1A and to set a gradation level of the additional white (W) subpixel 1A based on the gradation levels of the subpixels 1 employed. In this case, the gradation levels of the subpixels of the three primary colors of red (R), green (G) and blue (B) contained in the groups of subpixels are all involved.

Figure 9:
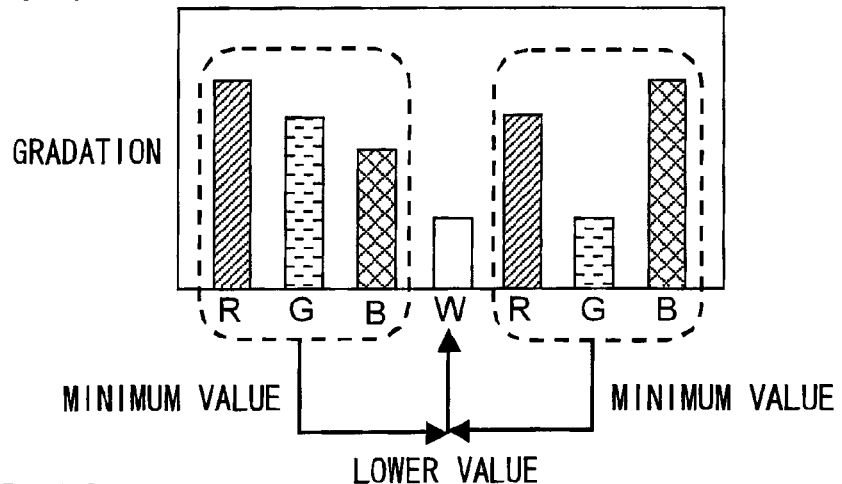
FIG. 9 is a diagram illustrating one method of setting a gradation level of a subpixel.

For example, as shown in FIG. 9, in two groups of subpixels included in one period, a subpixel having the lowest gradation level is selected from the subpixels 1 of the three primary colors of red (R), green (G) and blue (B) contained in the group of subpixels located on the left side of the additional white (W) subpixel 1A. In this example, the gradation level of the subpixel 1 represented by B is selected. In addition, a subpixel having the lowest gradation level is selected from the subpixels 1 of the three primary colors of red (R), green (G) and blue (B) contained in the group of subpixels located on the right side of the additional white (W) subpixel 1A. In this example, the gradation level of the subpixel 1 represented by G is selected. By comparing the selected two gradation levels, the gradation level of the additional white (W) subpixel 1A is set at the lower gradation level. In this example, it is set at the gradation level of the subpixel 1 represented by G included in the group of subpixels located on the right side.

Figure 10:
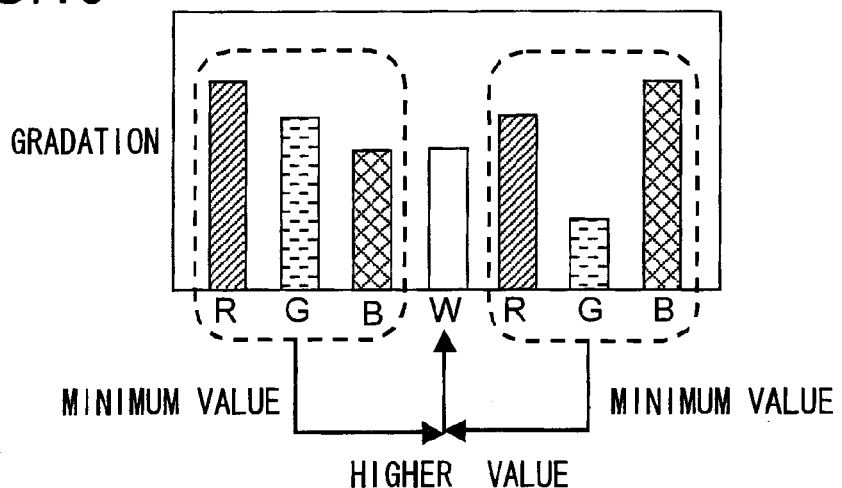
FIG. 10 is a diagram illustrating one method of setting a gradation level of a subpixel.

For another example, as shown in FIG. 10, by comparing the selected two gradation levels, the gradation level of the additional white (W) subpixel 1A may be set at the higher gradation level. In this example, it is set at the gradation level of the subpixel 1 represented by B included in the group of subpixels located on the left side.

Figure 11:
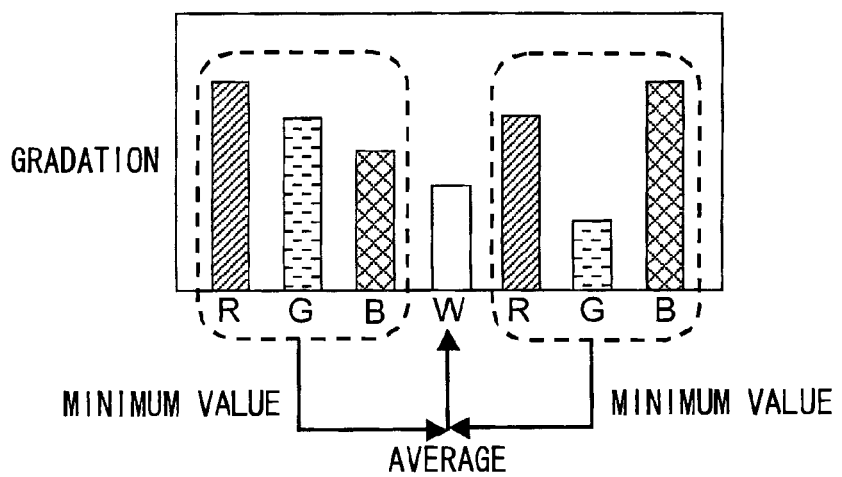
FIG. 11 is a diagram illustrating one method of setting a gradation level of a subpixel.

For yet another example, as shown in FIG. 11, the gradation level of the additional white (W) subpixel 1A may be set at the average of the selected two gradation levels. In this example, it is set at the average of the gradation level of the subpixel 1 represented by B included in the group of subpixels located on the left side and the gradation level of the subpixel 1 represented by G included in the group of subpixels located on the right side.

Only one of the methods described above may always be used, but the method to be used may be changed as necessary In this preferred embodiment, since the stripe arrangement is preferably used for the color arrangement of the subpixels 1, high-definition display can be achieved as compared with the other arrangements. Naturally, in this preferred embodiment, the mosaic arrangement may instead be used for the color arrangement of the subpixels 1.

Figure 12:
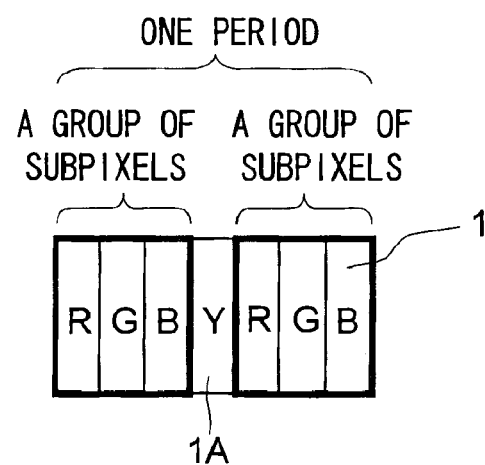
FIG. 12 is a schematic view showing a variation of the subpixel color arrangement in the display panel of the first preferred embodiment of the present invention.
Figure 13:
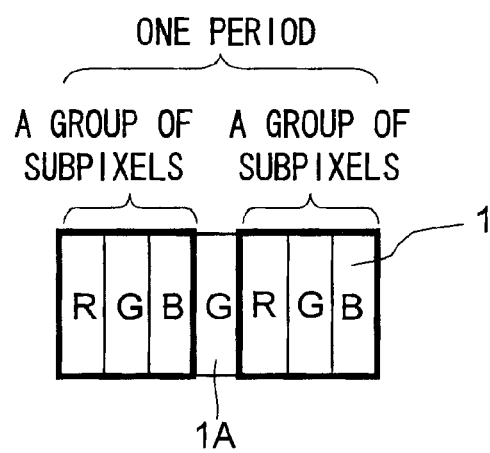
FIG. 13 is a schematic view showing a variation of the subpixel color arrangement in the display panel of the first preferred embodiment of the present invention.

The color of the additional subpixel 1A included in one period is not limited to white (W). As shown in FIGS. 12 and 13, for example, yellow (Y) (or cyan (C)) or green (G) having high brightness may be employed. When yellow (Y) (or cyan (C)) is employed for the additional subpixel 1A, a wide range of color reproduction as well as improved brightness is advantageously obtained.

Figure 14:
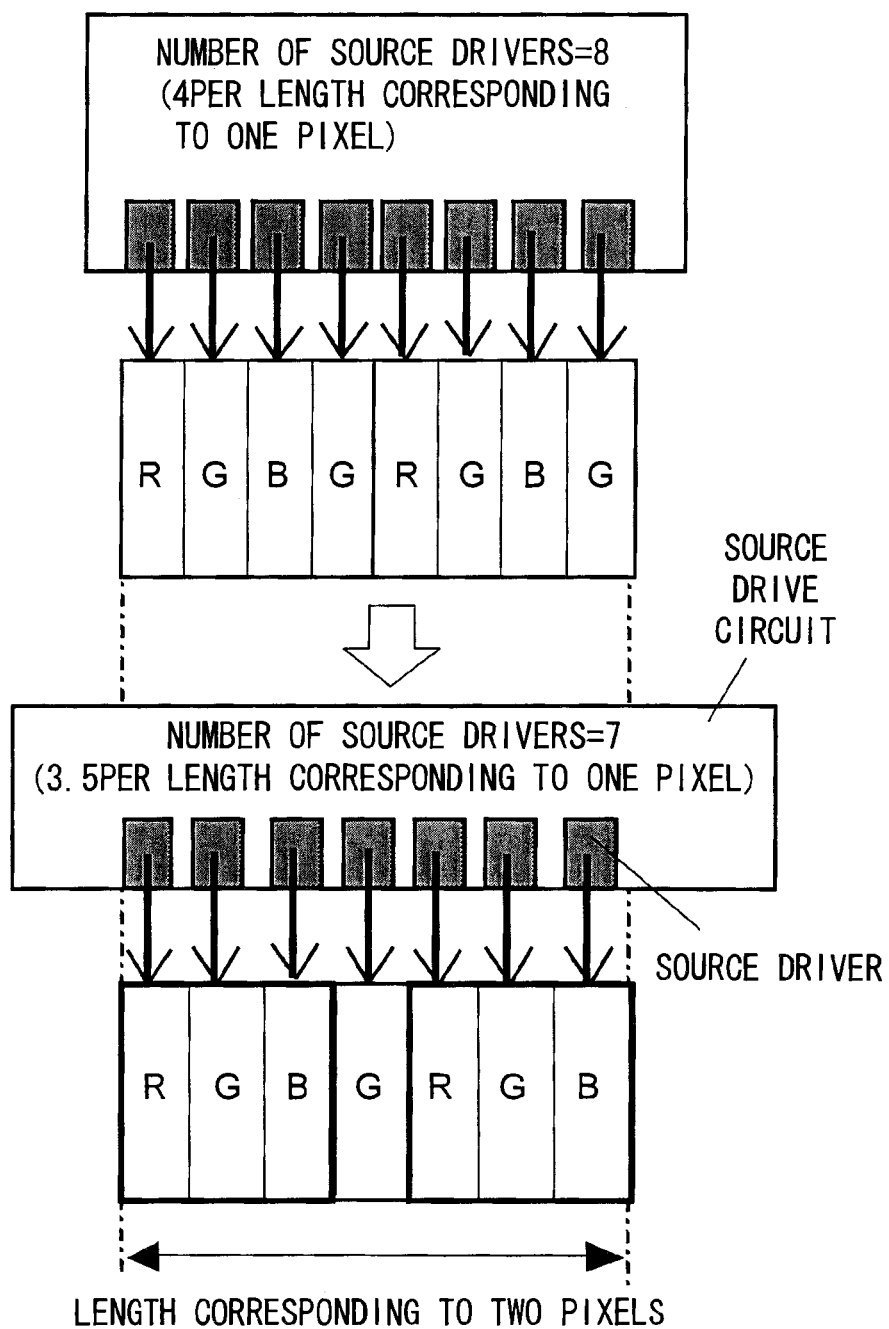
FIG. 14 is a diagram illustrating how the use of the color arrangement shown in FIG. 13 reduces the number of source drivers.

In a display device provided with a display panel having color arrangement shown in FIG. 13, as shown in the lower portion of FIG. 14, within the length of one period of color arrangement in the row direction, that is, within the length corresponding to two pixels, a total of six subpixels 1, that is, two groups of three subpixels 1, the number of groups being the same as that of pixels, are included and one additional green (G) subpixel, the number of which is less than that of pixels, is also included; thus, a total of seven source drivers are included that correspond to these individual subpixels. In contrast, in a conventional display device in which a subpixel is additionally provided for each pixel so as to improve brightness, as shown in the upper portion of FIG. 14, within the length corresponding to two pixels, a total of six subpixels 1, that is, two groups of three subpixels 1, the number of groups being the same as that of pixels, are included and two additional green (G) subpixels, the number of which is the same as that of pixels, are also included; thus, a total of eight source drivers are included that correspond to these individual subpixels. Thus, as expected, brightness can be improved while an increase in the number of source drivers is prevented, as compared with the conventional display device.

The colors of three-primary-color subpixels 1 contained in two groups of subpixels included in one period are not limited to the three primary colors of red (R), green (G) and blue (B). As long as color display is achieved, for example, three primary colors of cyan (C), yellow (Y) and magenta (M) that serve as complementary colors for the three primary colors may be used.

Figure 15:
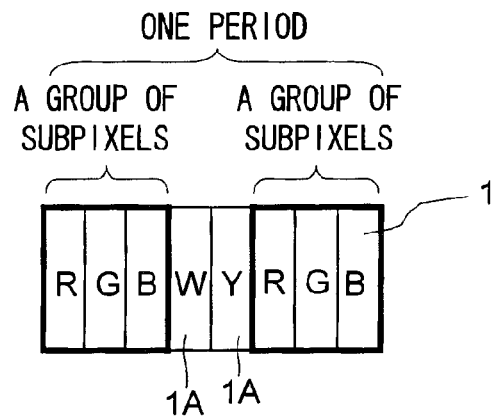
FIG. 15 is a schematic view showing a variation of the subpixel color arrangement in the display panel of the first preferred embodiment of the present invention.

As shown in FIG. 15, the number of additional subpixels 1A for two groups of subpixels included in one period may be, for example, two, those two subpixels composed of white (W) and yellow (Y) subpixels.

Figure 16:
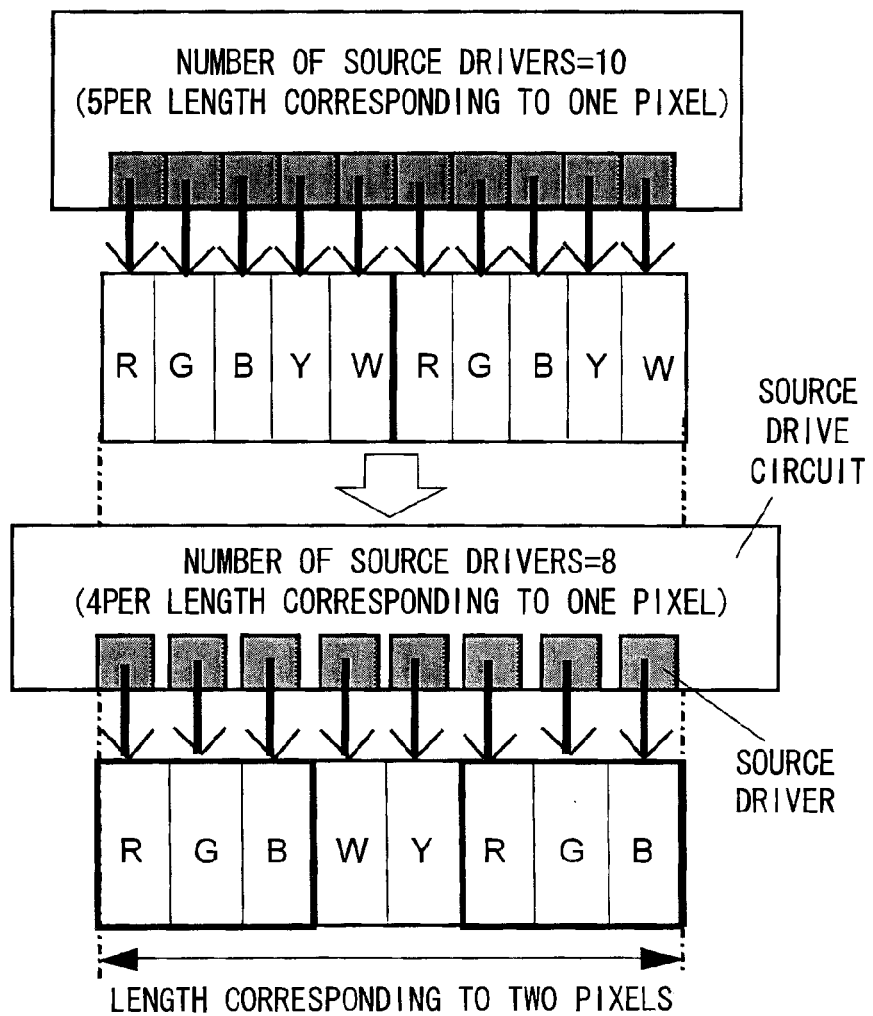
FIG. 16 is a diagram illustrating how the use of the color arrangement shown in FIG. 15 reduces the number of source drivers.

In a display device provided with a display panel having color arrangement shown in FIG. 15, as shown in the lower portion of FIG. 16, within the length of one period of color arrangement in the row direction, that is, within the length corresponding to two pixels, a total of six subpixels 1, that is, two groups of three subpixels 1, the number of groups being the same as that of pixels, are included and each one of additional white (W) and yellow (Y) subpixels, the number of subpixels of each color being less than that of pixels, is also included; thus, a total of eight source drivers are included that correspond to these individual subpixels. In contrast, in a conventional display device in which two subpixels are additionally provided for each pixel so as to improve brightness, as shown in the upper portion of FIG. 16, within the length corresponding to two pixels, a total of six subpixels 1, that is, two groups of three subpixels 1, the number of groups being the same as that of pixels, are included and two additional white (W) subpixels and two additional yellow (Y) subpixels, the number of subpixels of each color being the same as that of pixels, are also included; thus, a total of ten source drivers are included that correspond to these individual subpixels. Thus, as expected, brightness can be improved while an increase in the number of source drivers is prevented, as compared with the conventional display device.

Figure 17:
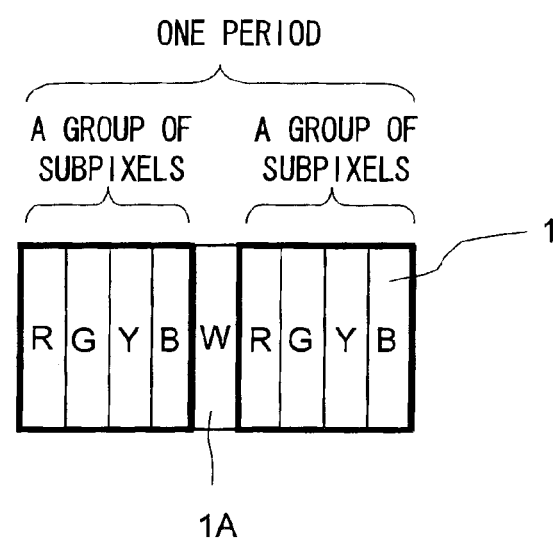
FIG. 17 is a schematic view showing a variation of the subpixel color arrangement in the display panel of the first preferred embodiment of the present invention.

In two groups of subpixels included in one period, the number of subpixels 1 contained in each group is not limited to three. It may be four (red (R), green (G), yellow (Y) and blue (B)) as shown in FIG. 17 or may be more than four. However, preferably, the number of subpixels 1 is practically about four at most in order to reduce the number of source drivers and the brightness of each subpixel 1.

Figure 18:
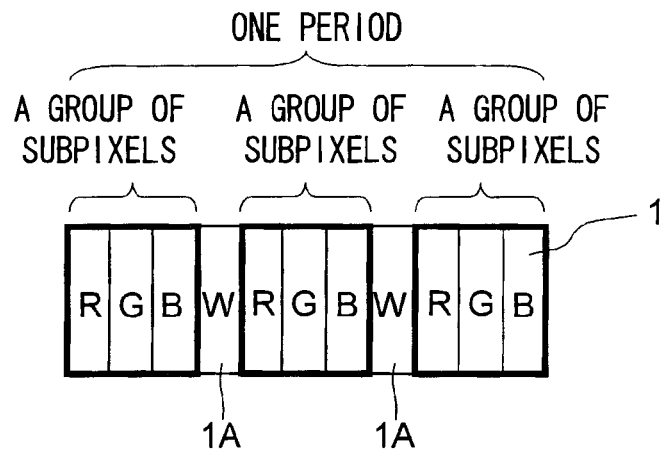
FIG. 18 is a schematic view showing a variation of the subpixel color arrangement in the display panel of the first preferred embodiment of the present invention.
Figure 19:
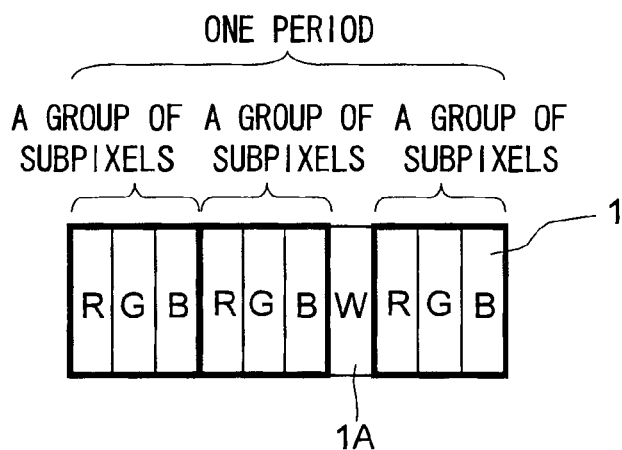
FIG. 19 is a schematic view showing a variation of the subpixel color arrangement in the display panel of the first preferred embodiment of the present invention.

The number of groups of subpixels included in one period is not limited to two. It may be three as shown in FIGS. 18 and 19 or may be more than three. In particular, FIG. 18 shows a case where one additional subpixel 1A is provided between each group of subpixels included in one period. FIG. 19 shows a case where one additional subpixel 1A is provided between each pair of groups of subpixels 1 included in one period. However, preferably, the number of groups of subpixels is practically about three at most in order to reduce the number of source drivers and the brightness of each subpixel 1.

Various color arrangements for the subpixels 1 included in one period are possible, as long as groups of subpixels each have the same subpixel configuration. However, care should be taken in the following respects. In general, when high-brightness subpixels 1 are adjacent to each other along each row, the light of the adjacent subpixels 1 is continuous in the form of lines across rows in a display image. This may result in linear unevenness such as striped unevenness appearing in one direction.

In a case where four-color subpixels 1 including an additional subpixel 1A are contained in one period, in order for such striped unevenness to be prevented, the following arrangements are preferably avoided in each row: an arrangement in which subpixels 1 having the highest brightness are adjacent to each other; an arrangement in which subpixels 1 having the second highest brightness are adjacent to each other; and an arrangement in which the subpixel 1 having the highest brightness is adjacent to the subpixel 1 having the second highest brightness.

Specifically, in a case where red (R), green (G), blue (B) and white (W) subpixels are contained in one period (here, the white (W) subpixel is an additional subpixel 1A), since white (W), green (G), red (R) and blue (B) subpixels have increasingly lower brightness in this order, as shown in FIGS. 1 and 2, the subpixels are arranged in order of, for example, red (R), green (G), blue (B), white (W), red (R), green (G) and blue (B) subpixels. They may be arranged in order of red (R), green (G), blue (B), white (W), blue (B), green (G) and red (R) subpixels. In a case where red (R), green (G), blue (B) and yellow (Y) (or cyan (C)) subpixels are contained in one period (here, the yellow (Y) (or cyan (C)) subpixel is an additional subpixel 1A), since yellow (Y), green (G), red (R) and blue (B) subpixels have increasingly lower brightness in this order, as shown in FIG. 12, the subpixels are arranged in order of, for example, red (R), green (G), blue (B), yellow (Y) (or cyan (C)), red (R), green (G) and blue (B) subpixels. They may be arranged in order of red (R), green (G), blue (B), yellow (Y) (or cyan (C)), blue (B), green (G) and red (R) subpixels.

In a case where three-color subpixels 1 including an additional subpixel 1A are contained in one period, preferably, the subpixels having the highest brightness are not arranged adjacent to each other along each row. Specifically, in a case where red (R), green (G) and blue (B) subpixels are contained in one period (here, the green (G) subpixel is an additional subpixel 1A), since green (G), red (R) and blue (B) subpixels have increasingly lower brightness in this order, as shown in FIG. 13, the subpixels are arranged in order of, for example, red (R), green (G), blue (B), green (G), red (R), green (G) and blue (B) subpixels. They may be arranged in order of red (R), green (G), blue (B), green (G), blue (B), green (G) and red (R) subpixels.

Figure 20:
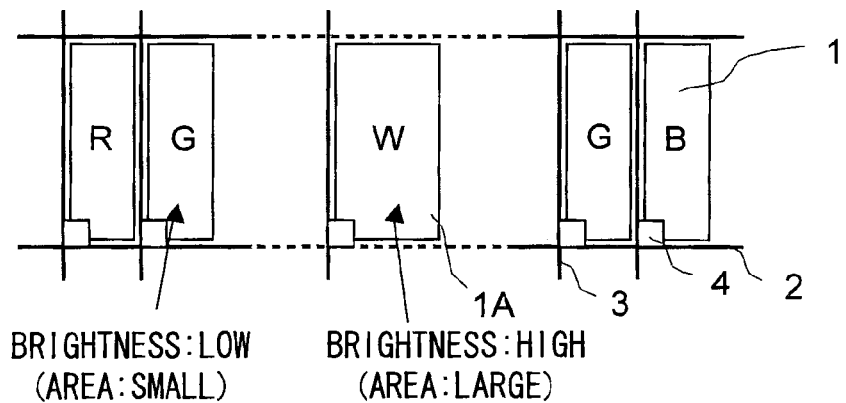
FIG. 20 is an enlarged plan view showing the configuration of a display panel in a display device according to a second preferred embodiment of the present invention.

With reference to FIG. 20, a description will now be given of a second preferred embodiment of the present invention. This second preferred embodiment differs from the first preferred embodiment in that brightness is intended to be further improved. FIG. 20 is an enlarged plan view showing the configuration of a display panel in a display device according to the second preferred embodiment. In FIG. 20, elements having the same names and functions as in FIGS. 1 to 18 are identified with common reference numerals, and the description thereof will not be repeated. This applies equally to third and fourth preferred embodiments, which will be described later.

In this second preferred embodiment, as shown in FIG. 20, the area of an additional subpixel 1A included in subpixels 1 contained in one period is enlarged. That is, the area of the additional white (W) subpixel 1A is larger than the areas of the subpixels 1 of the light's three primary colors of red (R), green (G) and blue (B) contained in a group of subpixels. Since the additional white (W) subpixel 1A has higher brightness than that of the red (R), green (G) and blue (B) subpixels 1 and has a large area relative to them, the brightness of the additional white (W) subpixel is further increased. This results in improved basic performance of the display device.

However, care should be taken in the following respects. When the subpixels 1 and 1A vary in area, liquid crystal of the subpixels 1 and 1A varies in capacitance. This causes the subpixels 1 and 1A to vary in field-through voltage. Since the capacitance of liquid crystal varies with the voltage applied to the liquid crystal, the field-thorough voltage varies with the applied voltage. This may cause flicker and burn-in.

The field-through voltage is given by equation (1) below.

$$\Delta Vd = Cgd/(Cgd+Clc+Ccs) \times Vgpp \qquad (1)$$

where ΔVd represents the field-through voltage, Cgd represents a gate-to-drain capacitance, Clc represents the capacitance of liquid crystal, Ccs represents auxiliary capacitance and Vgpp represents the difference between the maximum and minimum values of a gate signal.

Here, if the area of a subpixel 1 is assumed to be n times larger than the areas of other subpixels 1, the capacitance Clc of liquid crystal is approximately n times higher than that of other subpixels 1. Then, if the gate-to-drain capacitance Cgd and the auxiliary capacitance Ccs of the subpixel 1 are each set n times higher than those of other subpixels 1, the term "Cgd/(Cgd+Clc+Ccs)" of equation (1) above is constant, so that the field-through voltage ΔVd is constant. Thus, it is possible to reduce flicker and burn-in. Hence, preferably, the ratio of the gate-to-drain capacitance and the ratio of the auxiliary capacitance between each of the additional subpixel 1A and the subpixels 1 contained in a group of subpixels 1 are made substantially equal to the ratio of the area between each of the additional subpixel 1A and the subpixels 1.

Figure 21:
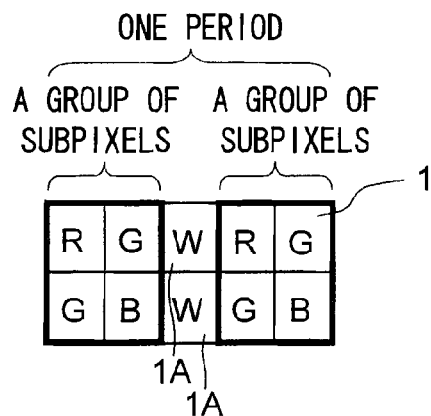
FIG. 21 is an enlarged schematic view showing a subpixel color arrangement in the display panel according to a third preferred embodiment of the present invention.

With reference to FIG. 21, a description will now be given of a third preferred embodiment of the present invention. This third preferred embodiment differs from the first and second preferred embodiments in that the color arrangement of subpixels is varied. FIG. 21 is an enlarged schematic view showing a subpixel color arrangement in a display panel in a display device according to the third preferred embodiment.

In the display panel of this preferred embodiment, as shown in FIG. 21, a variation of a typical square arrangement is employed for the color arrangement of subpixels 1. The length corresponding to two pixels in the row direction is assumed to be one period of color arrangement, and this is repeatedly arranged in the row direction. In one such period, the subpixels 1 are arranged in two rows so as not to be displaced.

Specifically, in one such period, five subpixels 1 of red (R), green (G), white (W), red (R) and green (G) are arranged in the first row; five subpixels 1 of green (G), blue (B), white (W), green (G) and blue (B) are arranged in the second row. The red (R), green (G) and blue (B) subpixels 1 located in the left half of one period and arranged in two rows and two columns constitute a group of subpixels 1 corresponding to one pixel; the red (R), green (G) and blue (B) subpixels 1 located in the right half of one period and arranged in two rows and two columns constitute a group of subpixels 1 corresponding to the other pixel. The additional subpixels 1A for improving brightness are arranged in two rows and one column therebetween. That is, in one such period, the subpixels 1 (each one of red (R) and green (G) subpixels in the first row and each one of green (G) and blue (B) subpixels in the second row) of the light's three primary colors of red (R), green (G) and blue (B) are included in each of two groups of subpixels, and the additional subpixels 1A (one in each of two rows) of white (W) or the fourth color are also included. Such two rows are repeatedly arranged in the column direction.

Even in the display panel configured as described above, since in one period of color arrangement in the row direction, that is, in the length corresponding to two pixels, one column of additional white (W) subpixels 1A, the number of columns being less than the number of pixels, is included, the same benefits as in the first preferred embodiment are obtained.

Figure 22:
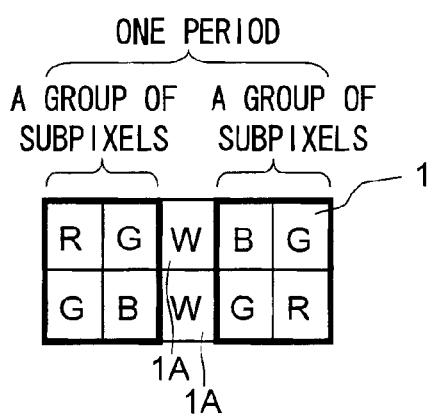
FIG. 22 is a schematic view showing a variation of the subpixel color arrangement in the display panel of the third preferred embodiment of the present invention.

In the color arrangement shown in FIG. 21, as long as groups of subpixels each have the same subpixel configuration, as shown in FIG. 22, the red (R) and blue (B) subpixels in three-primary-color subpixels 1 of one of the groups of subpixels may be exchanged with each other.

Figure 23:
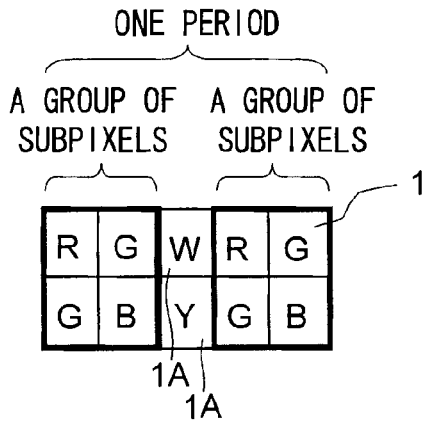
FIG. 23 is a schematic view showing a variation of the subpixel color arrangement in the display panel of the third preferred embodiment of the present invention.

As in the first preferred embodiment, the color of the additional subpixels 1A included in one period is not limited to white (W). As shown in FIG. 23, for example, one of the additional subpixels may be replaced with a yellow (Y) (or cyan (C)) subpixel having higher brightness. A green (G) subpixel may be used instead; yellow (Y), cyan (C) and green (G) subpixels may be used as the two additional subpixels.

As in the first preferred embodiment, for example, cyan (C), yellow (Y) and magenta (M) subpixels may be used as the three-primary-color subpixels contained in two groups of subpixels included in one period.

Figure 24:
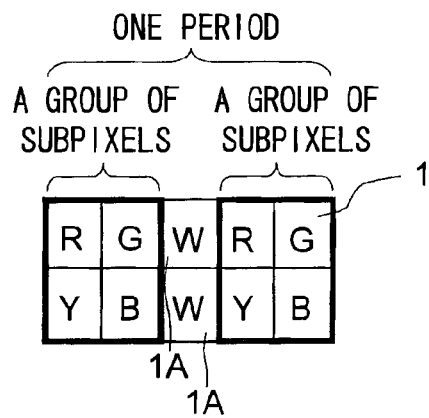
FIG. 24 is a schematic view showing a variation of the subpixel color arrangement in the display panel of the third preferred embodiment of the present invention.
Figure 25:
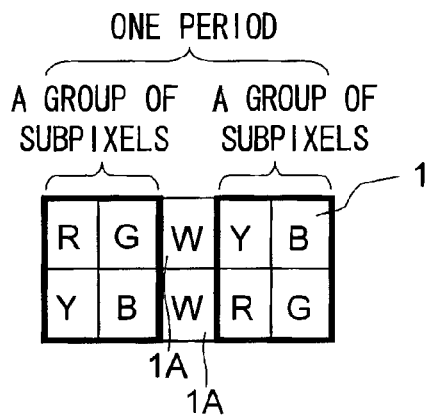
FIG. 25 is a schematic view showing a variation of the subpixel color arrangement in the display panel of the third preferred embodiment of the present invention.

In two groups of subpixels included in one period, the colors of subpixels 1 are not limited to three colors of red (R), green (G) and blue (B) (each one of red (R) and green (G) subpixels in the first row and each one of green (G) and blue (B) subpixels in the second row). As shown in FIG. 24, one of the two green (G) subpixels may be replaced with a yellow (Y) (or cyan (C)) subpixel. Moreover, as shown in FIG. 25, in two groups of subpixels included in one period, the color arrangement of subpixels 1 contained in one of the two groups of subpixels may be inverted with respect to the color arrangement of subpixels 1 contained in the other of the two groups of subpixels.

As in the first preferred embodiment, the number of groups of subpixels included in one period is not limited to two. It may be three or more than three.

In order to prevent the striped unevenness, care should be taken in the same respects as in the first preferred embodiment.

Figure 26:
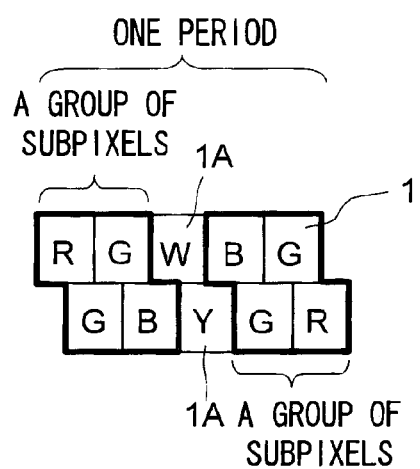
FIG. 26 is a schematic view showing a variation of the subpixel color arrangement in the display panel of the third preferred embodiment of the present invention.
Figure 27:
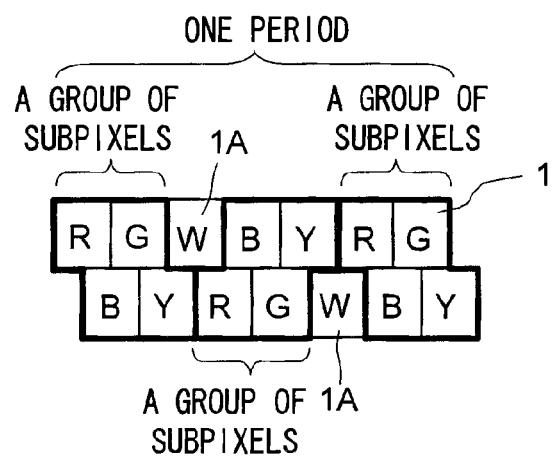
FIG. 27 is a schematic view showing a variation of the subpixel color arrangement in the display panel of the third preferred embodiment of the present invention.

Although in this third preferred embodiment, the subpixels 1 are arranged in two rows so as not to be displaced, for example, as shown in FIGS. 26 and 27, they may be arranged in two rows such that one row is shifted by one-half of the subpixel relative to the next. In FIG. 26, each group of subpixels is composed of four subpixels 1 of red (R), green (G), blue (B) and green (G), and each one of additional white (W) and yellow (Y) subpixels 1A, the total number of additional subpixels being two, is arranged between these two groups of subpixels. In FIG. 27, each group of subpixels is composed of four subpixels of red (R), green (G), blue (B) and yellow (Y), and one additional white (W) subpixel is arranged between each of the groups of subpixels.

Figure 28:
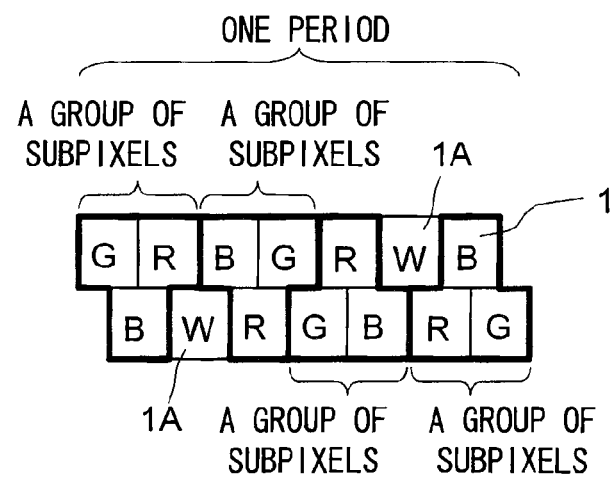
FIG. 28 is an enlarged schematic view showing a subpixel color arrangement in the display panel according to a fourth preferred embodiment of the present invention.

With reference to FIG. 28, a description will now be given of a fourth preferred embodiment of the present invention. This fourth preferred embodiment differs from the first and second preferred embodiments in that the color arrangement of subpixels 1 is varied. FIG. 28 is an enlarged schematic view showing a subpixel color arrangement in a display panel in a display device according to the fourth embodiment.

In the display panel of this preferred embodiment, as shown in FIG. 28, a variation of a typical delta arrangement is preferably used for the color arrangement of subpixels 1. The length corresponding to four pixels in the row direction is assumed to be one period of color arrangement, and this is repeatedly arranged in the row direction. In one such period, the subpixels 1 are arranged in two rows such that one row is shifted by one-half of the subpixel relative to the next.

Specifically, in one such period, seven subpixels 1 of green (G), red (R), blue (B), green (G), red (R), white (W) and blue (B) are arranged in the first row; seven subpixels 1 of blue (B), white (W), red (R), green (G), blue (B), red (R) and green (G) are arranged in the second row so as to be shifted by one-half of the subpixel in the right direction. Two red (R) subpixels 1, two green (G) subpixels 1 and two blue (B) subpixels 1 located in the left half of one period to form two rows constitute one set of two groups of subpixels 1; two red (R) subpixels 1, two green (G) subpixels 1 and two blue (B) subpixels 1 located in the right half of one period to form two rows constitute the other set of two groups of subpixels 1. One additional white (W) subpixel 1A for improving brightness is arranged between a pair of groups of subpixels located in each of the left and right halves. That is, in one such period, the subpixels of the light's three primary colors of red (R), green (G) and blue (B) are included in each set of two groups of subpixels located in the left and right halves, and one additional subpixels 1A of white (W) or the fourth color is also included in each set of two groups of subpixels. Such two rows are repeatedly arranged in the column direction.

Even in the display panel configured as described above, since in one period of color arrangement in the row direction, that is, in the length corresponding to four pixels, one additional white (W) subpixel 1A, the number of which is less than the number of pixels, is included in each pair of groups of subpixels located in the left and right halves, the same benefits as in the first embodiment are obtained.

Figure 29:
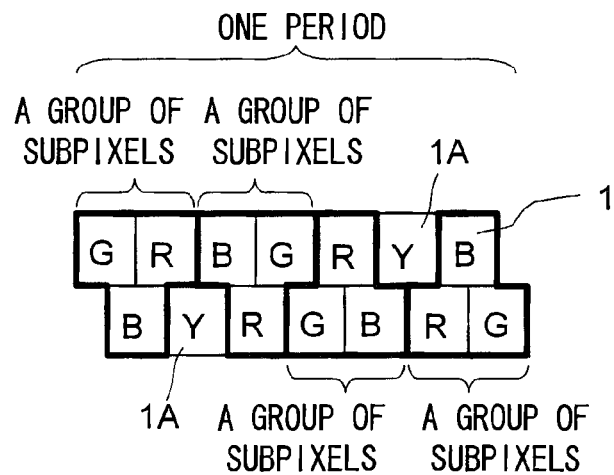
FIG. 29 is a schematic view showing a variation of the subpixel color arrangement in the display panel of the fourth preferred embodiment of the present invention.

As in the first preferred embodiment, the color of the additional subpixels 1A included in one period is not limited to white (W). As shown in FIG. 29, for example, yellow (Y) (or cyan (C)) subpixels having higher brightness may be used. Green (G) subpixels may also be used; one of the additional subpixels may be replaced with a yellow (Y), cyan (C) or green (G) subpixel.

Figure 30:
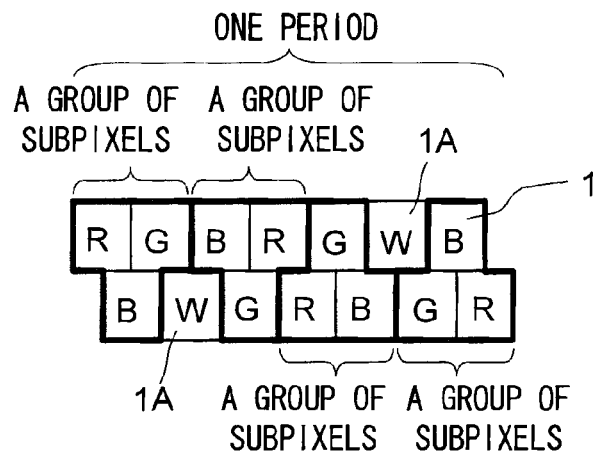
FIG. 30 is a schematic view showing a variation of the subpixel color arrangement in the display panel of the fourth preferred embodiment of the present invention.
Figure 31:
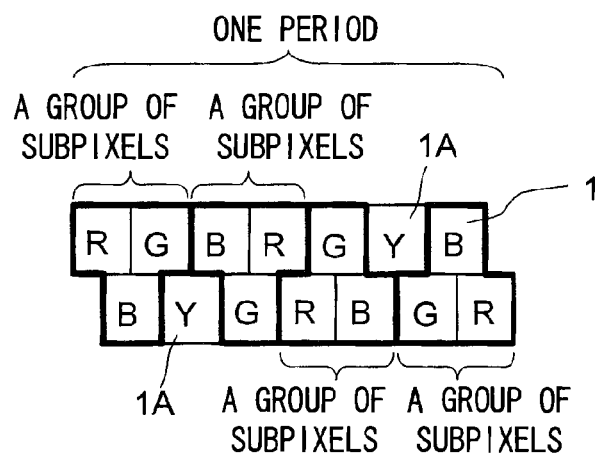
FIG. 31 is a schematic view showing a variation of the subpixel color arrangement in the display panel of the fourth preferred embodiment of the present invention.

Variations of the color arrangement of subpixels 1 excluding the additional subpixels 1A are shown in FIGS. 30 and 31.

As in the first preferred embodiment, for example, cyan (C), yellow (Y) and magenta (M) subpixels may be used as the three-primary-color subpixels contained in each set of two groups of subpixels included in one period.

As in the first preferred embodiment, the number of groups of subpixels included in one period is not limited to four. It may be more than four.

In order to prevent the striped unevenness, care should be taken in the same respects as in the first preferred embodiment.

Figure 32:
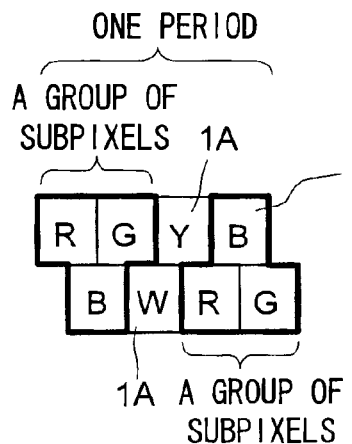
FIG. 32 is an enlarged schematic view showing a subpixel color arrangement in the display panel according to a fifth preferred embodiment of the present invention.
Figure 33:
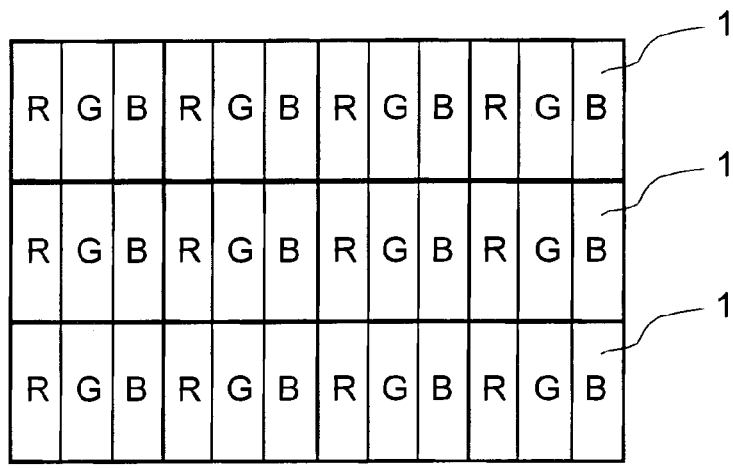
FIG. 33 is a diagram showing a typical stripe arrangement.
Figure 34:
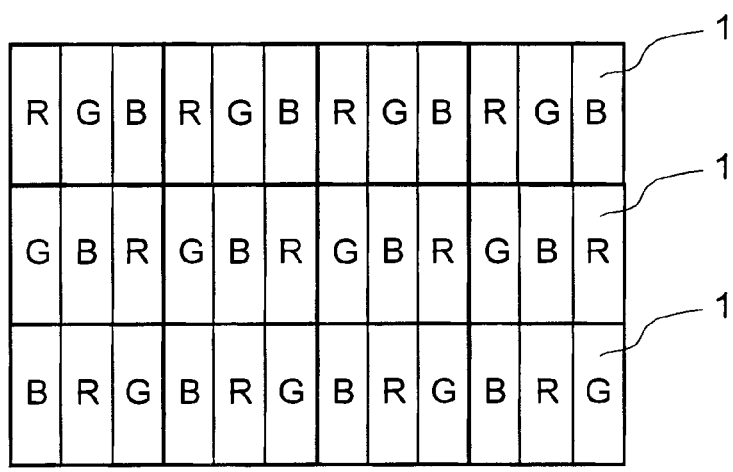
FIG. 34 is a diagram showing a typical mosaic arrangement.
Figure 35:
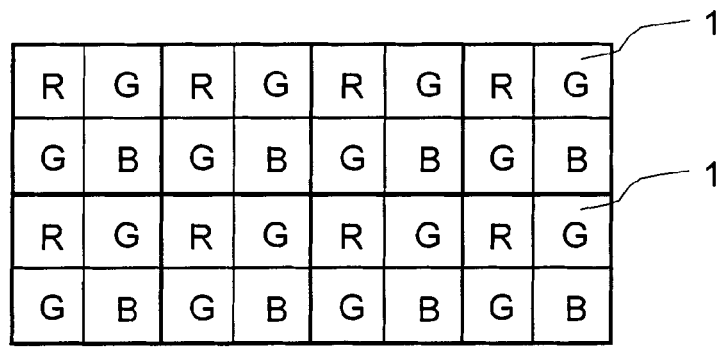
FIG. 35 is a diagram showing a typical square arrangement.
Figure 36:
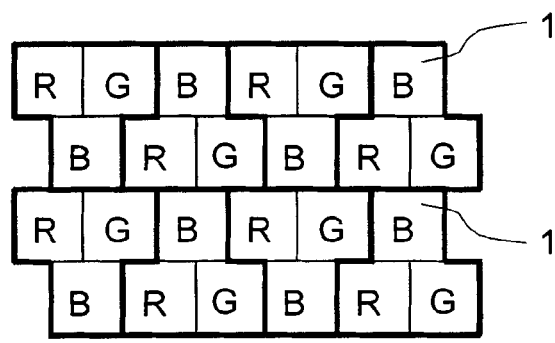
FIG. 36 is a diagram showing a typical delta arrangement.

With reference to FIG. 32, a description will now be given of a fifth preferred embodiment of the present invention. This fifth preferred embodiment differs from the fourth preferred embodiment in that the color arrangement of subpixels 1 is varied. FIG. 32 is an enlarged schematic view showing a subpixel color arrangement in a display panel in a display device according to the fifth preferred embodiment.

In the display panel of this preferred embodiment, as shown in FIG. 32, a variation of a typical delta arrangement is preferably used for the color arrangement of subpixels 1. The length corresponding to two pixels in the row direction is assumed to be one period of color arrangement, and this is repeatedly arranged in the row direction. In one such period, the subpixels 1 are arranged in two rows such that one row is shifted by one-half of the subpixel relative to the next.

Specifically, in one such period, four subpixels 1 of red (R), green (G), yellow (Y) and blue (B) are arranged in the first row; four subpixels 1 of blue (B), white (W), red (R) and green (G) are arranged in the second row so as to be shifted by one-half of the subpixel in the right direction. The red (R), green (G) and blue (B) subpixels 1 located in the left half of one period to form two rows constitute one of groups of subpixels 1; the red (R), green (G) and blue (B) subpixels 1 located in the right half of one period to form two rows constitute the other of the two groups of subpixels 1. Moreover, one additional yellow (Y) subpixel 1A and one additional white (W) subpixel 1A for improving brightness are provided in two rows, respectively. That is, in one such period, the subpixels 1 of the light's three primary colors of red (R), green (G) and blue (B) are included in each of the two groups of subpixels located in the left and right halves, and an additional subpixel 1A of white (W) or the fourth color and an additional subpixel 1A of yellow (Y) or the fifth color are also included. Such two rows are repeatedly arranged in the column direction.

Even in the display panel configured as described above, since in one period of color arrangement in the row direction, that is, in the length corresponding to two pixels, each one of the additional white (W) and yellow (Y) subpixels 1A, the number of each additional subpixel being less than that of pixels, is included, the same benefits as in the first preferred embodiment are obtained.

As in the fourth preferred embodiment, the colors of the additional subpixels 1A included in one period are not limited to white (W) and yellow (Y). They may be cyan (C) and green (G).

As in the fourth preferred embodiment, for example, cyan (C), yellow (Y) and magenta (M) subpixels may be used as the three-primary-color subpixels 1 contained in two groups of subpixels included in one period.

As in the first preferred embodiment, the number of groups of subpixels included in one period is not limited to two. It may be more than two.

In order to prevent the striped unevenness, care should be taken in the same respects as in the first preferred embodiment.

According to various preferred embodiments of the present invention, in a display device including a display panel having subpixels arranged on a display screen, each subpixel connected to a scanning line extending in a row direction and a signal line extending in the column direction, when a value obtained by dividing the length of the display screen in the row direction by the number of pixels in the row direction is a length corresponding to one pixel in the row direction, one period of color arrangement in the row direction is a length corresponding to m (two or more) pixels. In a first configuration, one such period of color arrangement includes: m groups of subpixels that include at least subpixels of the light's three primary colors or three primary colors serving as complementary colors for the light's three primary colors, that are arranged in one row and that have the same subpixel configuration; and one or more but less than m additional subpixels. In a second configuration, one such period of color arrangement includes: m groups of subpixels that include at least subpixels of the light's three primary colors or three primary colors serving as complementary colors for the light's three primary colors, that are arranged in two rows and two columns so as not to be disposed and that have the same subpixel configuration; and one or more but less than m columns of additional subpixels. In a third configuration, one such period of color arrangement includes: m groups of subpixels that include at least subpixels of the light's three primary colors or three primary colors serving as complementary colors for the light's three primary colors, that are arranged in two rows such that one row is shifted by one-half of the subpixel relative to the next and that have the same subpixel configuration; and one or more but less than m additional subpixels.

The present invention is not limited to the preferred embodiments described above. Many modifications and variations are possible without departing from the sprit of the invention. For example, the display panel according to the invention is not limited to a liquid crystal panel that includes liquid crystal sandwiched between a pair of substrates, electrodes formed on one of the substrates so as to correspond respectively to subpixels 1 and common electrodes and color filters formed on the other substrate so as to face the electrodes. Specifically, the present invention can apply to any display panel in which color image display is achieved by driving with active elements such as TFTs 4 arranged for the subpixels 1, that is, by active matrix driving. The invention also can apply to organic electroluminescent (EL) panels.

Preferred embodiments of the present invention are useful in display devices provided with a liquid crystal panel or an organic electroluminescent (EL) panel.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A display device comprising:
    a display panel including subpixels arranged on a display screen, each subpixel connected to a scanning line extending in a row direction and a signal line extending in a column direction; wherein
    when a value obtained by dividing a total length of the display screen in the row direction by a total number of pixels in the row direction is a length corresponding to one pixel in the row direction, one period of color arrangement in the row direction is a length corresponding to m pixels, where m is equal to at least two or more, the one period of color arrangement comprising: m groups of subpixels that include at least subpixels of light's three primary colors or three primary colors serving as complementary colors for the light's three primary colors, that are arranged in one row and that have a same subpixel configuration; and
    at least one but less than m additional subpixels, and the length of the one pixel in the row direction is longer than a length of one of the groups of subpixels in the row direction.

2. The display device of claim 1, wherein a stripe arrangement is used for color arrangement in the display panel.

3. The display device of claim 1, wherein a number of subpixels included in the one period of color arrangement and arranged in a line is an odd number.

4. The display device of claim 1, wherein one of the additional subpixels is included between each of all the groups of subpixels, and a total number of additional subpixels included is m−1.

5. The display device of claim 1, wherein source signals having voltages whose positive/negative polarities are periodically inverted are applied to the signal lines such that the polarities alternate on a one-subpixel-by-one-subpixel or two-subpixels-by-two-subpixels basis with respect to each row.

6. The display device of claim 1, wherein the groups of subpixels include no subpixels having higher brightness than the additional subpixels.

7. The display device of claim 6, wherein colors of the additional subpixels are white, yellow, cyan and green.

8. The display device of claim 1, wherein the additional subpixels and subpixels contained in the groups of subpixels have substantially a same area.

9. The display device of claim 1, wherein areas of the additional subpixels are larger than those of subpixels contained in the groups of subpixels.

10. The display device of claim 1, wherein, when at least four-color subpixels are included in the one period of color arrangement and the additional subpixels are of one color, of the at least four-color subpixels, no two subpixels having a highest brightness are adjacent to each other along each row, no two subpixels having a second highest brightness are adjacent to each other along each row and no two subpixels having the highest brightness and the second highest brightness are adjacent to each other along each row.

11. The display device of claim 1, wherein three-color subpixels are included in the one period of color arrangement, and, of the three-color subpixels, no two subpixels having a highest brightness are adjacent to each other along each row.

12. The display device of claim 1, wherein a gradation level of the additional subpixel is set based on gradation levels of subpixels included in either a group of subpixels located on a left side of the additional subpixel or a group of subpixels located on a right side of the additional subpixel.

13. The display device of claim 12, wherein the gradation level of the additional subpixel is set at a lowest gradation level of the gradation levels of the subpixels included in one of the groups of subpixels.

14. The display device of claim 1, wherein a gradation level of the additional subpixel is set based on gradation levels of subpixels included in both a group of subpixels located on a left side of the additional subpixel and a group of subpixels located on a right side of the additional subpixel.

15. The display device of claim 14, wherein the gradation level of the additional subpixel is set at a lower gradation level obtained by comparing a lowest gradation level of the gradation levels of the subpixels included in the group of subpixels located on the left side and a lowest gradation level of the gradation levels of the subpixels included in the group of subpixels located on the right side.

16. The display device of claim 14, wherein the gradation level of the additional subpixel is set at a higher gradation level obtained by comparing a lowest gradation level of the gradation levels of the subpixels included in the group of subpixels located on the left side and a lowest gradation level of the gradation levels of the subpixels included in the group of subpixels located on the right side.

17. The display device of claim 14, wherein the gradation level of the additional subpixel is set at an average between a lowest gradation level of the gradation levels of the subpixels included in the group of subpixels located on the left side and a lowest gradation level of the gradation levels of the subpixels included in the group of subpixels located on the right side.

18. The display device of claim 1, wherein a ratio of a gate-to-drain capacitance and a ratio of an auxiliary capacitance between the additional subpixel and a subpixel included in the groups of subpixels are substantially equal to a ratio of an area between the additional subpixel and the subpixel in the groups of subpixels.

\* \* \* \* \*